United States Patent
Maeda et al.

(10) Patent No.: US 6,561,412 B2
(45) Date of Patent: May 13, 2003

(54) METHOD OF JOINING TOGETHER SUPERCONDUCTORS AND A SUPERCONDUCTOR JOINED MEMBER PRODUCED BY SAME

(75) Inventors: Jyunya Maeda, Tokyo (JP); Susumu Seiki, Tokyo (JP); Teruo Izumi, Tokyo (JP); Yuh Shiohara, Tokyo (JP)

(73) Assignee: Superconductivity Research Laboratory, Tokyo (JP)

( * ) Notice: Subject to any disclaimer, the term of this patent is extended or adjusted under 35 U.S.C. 154(b) by 0 days.

(21) Appl. No.: 09/726,263

(22) Filed: Nov. 30, 2000

(65) Prior Publication Data

US 2001/0015371 A1 Aug. 23, 2001

(30) Foreign Application Priority Data

Dec. 1, 1999 (JP) .......................................... 11-341596

(51) Int. Cl.[7] .......................... B23K 1/19; B23K 20/16; B23K 31/00; B23K 1/00
(52) U.S. Cl. ............................ 228/262.1; 228/262.2; 228/246; 228/248.1; 29/599; 505/917; 505/918; 505/919; 505/920; 505/925; 505/926; 505/927
(58) Field of Search ...................... 228/248.1, 262.1, 228/262.2, 121, 101, 246, 249, 250; 29/599, 1; 505/100, 220, 234, 917–920, 925–927

(56) References Cited

U.S. PATENT DOCUMENTS

| | | | | |
|---|---|---|---|---|
| 3,144,704 A | * | 8/1964 | Quinn ...................... 174/126.4 |
| 3,593,110 A | * | 7/1971 | Huebener ...................... 322/2 |
| 4,713,878 A | * | 12/1987 | Kumpitsch et al. ........... 29/599 |
| 5,034,373 A | * | 7/1991 | Smith et al. ................ 419/21 |
| 5,051,397 A | * | 9/1991 | Sato et al. ...................... 505/1 |
| 5,075,253 A | * | 12/1991 | Sliwa, Jr. ................... 257/723 |
| 5,084,439 A | * | 1/1992 | Hermann et al. ............... 505/1 |
| 5,244,876 A | * | 9/1993 | Preisler et al. .................. 505/1 |
| 5,302,580 A | * | 4/1994 | Shimizu et al. ............. 428/632 |
| 5,308,831 A | * | 5/1994 | Fevrier et al. ............... 505/100 |
| 5,786,304 A | * | 7/1998 | Kimura et al. .............. 505/234 |
| 5,874,175 A | * | 2/1999 | Li .............................. 428/408 |
| 6,159,905 A | * | 12/2000 | Buzcek et al. ........... 174/125.1 |
| 6,235,685 B1 | * | 5/2001 | Maeda et al. ............... 505/470 |

FOREIGN PATENT DOCUMENTS

| | | | | |
|---|---|---|---|---|
| JP | 59-107586 | * | 6/1984 | ................. 228/144 |
| JP | 61-64084 | * | 4/1986 | .............. 228/248.1 |
| JP | 6-211588 | | 8/1994 | |

* cited by examiner

Primary Examiner—Tom Dunn
Assistant Examiner—L. Edmondson
(74) Attorney, Agent, or Firm—Flynn, Thiel, Boutell & Tanis, P.C.

(57) ABSTRACT

Methods for implementing production of an oxide superconductor joined member, excellent in electric current transmission performance, without a need of going through particularly complex steps, are provided. When joining together oxide superconductors by use of a solder composed of an oxide superconducting material, a finally solidified portion of the solder is positioned in a region where a transmission path of electric current flowing between oxide superconductor base materials as joined together is not obstructed by, for example, disposing the solder on a face of the oxide superconductor base materials, other than butting surfaces of the oxide superconductor base materials, so as to straddle both the base materials like bridge-building. Current flow is also not obstructed by, for example, shaping junction faces of the oxide superconductor base materials such that at least portions of the butting surfaces thereof are in the shape of sloped open faces, parting from each other. Further, an oxide superconductor joined member is made by joining the base materials with each other through the intermediary of an oxide superconductor, serving as a binder, disposed on at least a face of the base materials, other than butting surfaces thereof.

14 Claims, 6 Drawing Sheets

FIG. 3a (PRIOR ART)
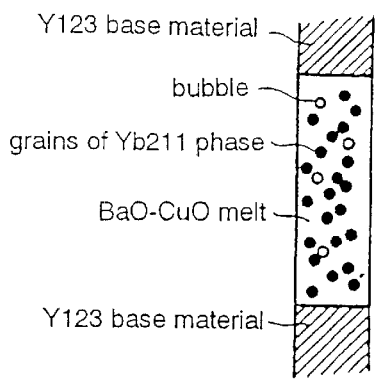
FIG. 3c (PRIOR ART)
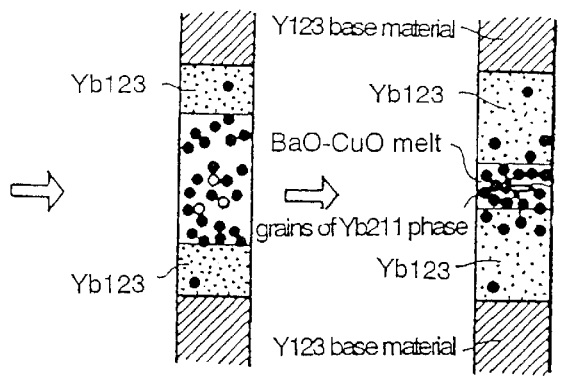
FIG. 3b (PRIOR ART)
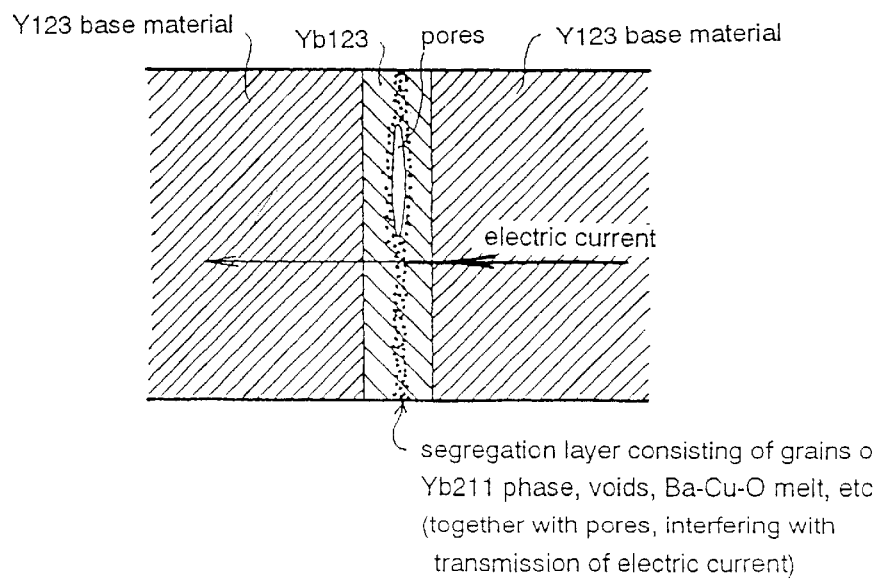
FIG. 4 (PRIOR ART)

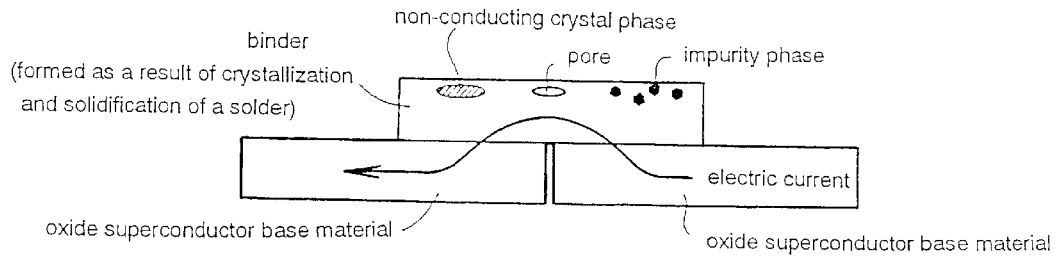
FIG. 5
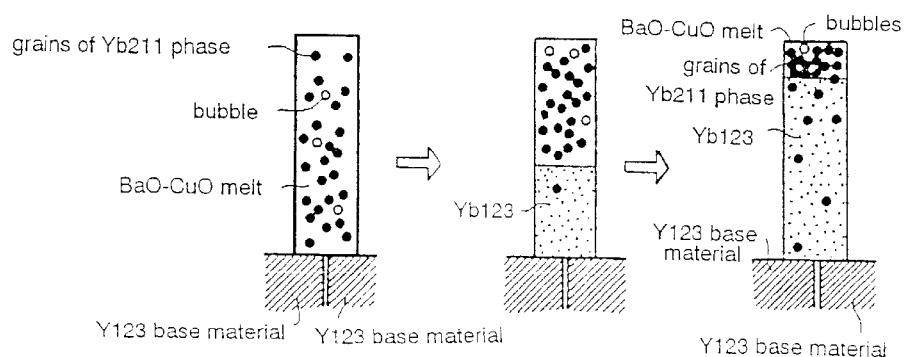
FIG. 6a     FIG. 6b     FIG. 6c

METHOD OF JOINING TOGETHER SUPERCONDUCTORS AND A SUPERCONDUCTOR JOINED MEMBER PRODUCED BY SAME

BACKGROUND

1. Field of the Invention

The present invention relates to a method of joining together oxide superconductors for producing an oxide superconductor joined member having excellent electric current transmission performance, enabling electric current transmission to be effected at high efficiency, and to the oxide superconductor joined member having excellent electric current transmission performance, so that electric current lead wires and superconducting wire rods, excellent in electric current transmission performance, can be produced.

2. Description of the Related Art

There have recently been discovered oxide superconductors having high critical temperatures such as, for example, $LiTi_2O_3$, $Ba(Bi, Pb)O_3$, $(Ba, K) BiO_3$, $(La, Sr)_2CuO_4$, $REBa_2Cu_3O_7$ (RE refers to rare-earth elements), $Bi_2Sr_2Ca_2Cu_3O_{10}$, $Ti_2Ba_2Ca_2Cu_3O_{10}$ or $HgBa_2Ca_2Cu_3O_8$ and so forth, one after another. As a result, commercial application of these materials to powerful superconducting magnets, fly wheels, superconducting magnetic bearings, and so forth, in various sectors of the industry, has been under study.

Among these oxide superconductors, a RE 123-type oxide crystal, that is, a "RE $Ba_2Cu_3O_y$ oxide superconductor (RE refers to one kind of rare-earth element, or not less than two kinds of rare-earth elements, selected from the group consisting of Y, La, Pr, Nd, Sm, Eu, Gd, Dy, Ho, Er, Tm, and Yb)" not only has a high critical temperature but also has come to attain a high critical current density in a magnetic field due to development of, and improvement on manufacturing techniques, so that the same is one of superconductors attracting most attention lately.

As one of the most common methods of preparing such an oxide crystal (bulk crystal) as described above, there has been well known a "melt-solidifying process" whereby a molten oxide material (crystal precursor material) is very slowly cooled from the neighborhood of a solidification starting temperature, thereby promoting solidification, and causing crystal growth to take place.

That is, the melt-solidifying process is a process utilizing solidification from a half- molten state, whereby a raw material for the bulk crystal from which the constitution of an RE 123-type oxide superconductor can be obtained normally in the atmosphere or in an atmosphere containing oxygen at low partial pressure is heated to not lower than a temperature (a peritectic point) at which a "123 phase (referred to hereinafter as RE 123 phase) of an RE $Ba_2Cu_3O_x$ oxide to be prepared" undergoes decomposition and melting, thereby causing the raw material to be decomposed and melted, and thereafter, is subjected to slow and gradual cooling at a temperature gradient or in an isothermal state, or is maintained in a supercooled temperature zone where growth of the RE 123 phase can take place, thereby promoting growth of the bulk crystal. In this case, a method of dipping a seed in a melt is commonly adopted in order to determine an orientation of the crystal to be grown.

And with the use of the melt-solidifying process, a RE 123 phase crystal (bulk crystal) of a large size can be stably obtained with relative ease.

Further, a "super cooled melt-solidifying process" aiming at shortening a crystal growth time has been well known as a method of preparing an oxide superconductor crystal (refer to Japanese Patent Laid-open No. H 6-211588).

The super cooled melt-solidifying process is a process whereby a molten precursor material is supercooled in as-molten state or as-half-molten state to a temperature zone below a solidification temperature, and is subjected to gradual cooling from a temperature reached as above or is kept at the temperature reached, thereby implementing crystal growth, and is a process intended to enhance a crystal growth speed by supercooling.

However, the oxide superconductor crystal (bulk crystal), obtained by those processes described above, and so forth, has been found to be material which is brittle and lacking in plasticity, and consequently, it has been difficult to form the same into a current lead wire, wire rod, and the like, of long length, by taking advantage of plasticity.

As a result, for production of the current lead wire, wire rod, and the like, of long length, with the use of the oxide superconductor crystal, it is necessary to produce "oxide superconductor rods" and "a conductive material coated with an oxide superconductor" by joining together a plurality of the oxide superconductor crystals.

As conventional means of joining together oxide superconducting crystals, there has been known a process of joining together oxide superconductor base materials by use of a solder (soldering material) of an oxide superconductor constitution, having a melting point (peritectic point) lower than that of the oxide superconductor base materials.

For example, in the text "Advances in Superconductivity VII", pp. 681 to 684, published by Springer-Verlag Tokyo Co., 1995, there is shown a joining process whereby a powdered solder of Yb 123 superconductor material ($Yb_{1.2}Ba_{2.1}Cu_{3.1}O_y$) constitution, having a melting point (peritectic point) lower than that of base materials of Y 123-type superconducting bulk crystal ($Y_{1.8}Ba_{2.4}Cu_{3.4}O_y$) as produced by the melt-solidifying process, is sandwiched between the base materials, is heated up to an intermediate temperature between the melting point of the base materials and that of the solder, thereby rendering the solder in as half-molten state, and thereafter, is subjected to gradual cooling with the result that a crystal (Yb 123 crystal) of a soldering material is caused to make epitaxial growth on the surface of the respective base materials, and through the intermediary of the solder as crystallized, the base materials are joined together.

FIG. 1 is a schematic view illustrating a manner whereby the powdered solder of Yb 123 superconductor material constitution(that is, $Yb211+Ba_3Cu_5O_x$) is held in a sandwich-like fashion between the base materials of the Y 123-type superconducting bulk crystal, and these materials are then placed in a heating furnace for joining together the base materials through heating and gradual cooling. In this case, heating and gradual cooling of the materials are carried out in the heating furnace according to a heating and cooling curve shown in FIG. 2 by way of example.

Now, in the case of superconducting current lead wires, superconducting wire rods, and the like, current density for the whole length thereof is determined depending on that of a portion thereof in the longitudinal direction, where superconductive properties are at the lowest level. Accordingly, adjustment of the material thereof is required so as to be able to obtain a uniform superconductive properties throughout the whole length thereof. However, since it is extremely difficult to homogenize the superconductive properties at a junction of the material, the superconductive properties at the junction becomes extremely important in the case of the superconducting current lead wires, and superconducting wire rods.

Not with standing the above, it has been found that the following problem is inherent in the above-described process of joining together the superconducting bulk crystals, whereby base materials of a Y 123 superconducting bulk crystal are joined together by sandwiching a solder of Yb 123 superconductor constitution therebetween.

More specifically, when the base materials with the solder sandwiched therebetween are subjected to heating and gradual cooling, crystallization of a Yb 211 phase of the solder, which is turned into a half-molten state, gradually proceeds from the surface of the respective base materials of a Y 123 phase towards the center of the solder, and consequently, a finally solidified portion of the solder, in the form of a layer, naturally comes to reside at the central position of the thickness of the solder interposed between the base materials.

Meanwhile, since there exist a non-superconducting BaO—CuO melt, and the Yb 211 phase, which is non-superconducting, as a second phase, within the solder (crystal precursor) which is turned into a half-molten liquid phase after heated to a high temperature, inclusions such as the non-superconducting Yb 211 phase, BaO—CuO, and so forth are tend to remain in the form of a layer within the finally solidified portion of the solder even though the Yb 211 phase reacts with the melt to be solidified while forming a superconductive Yb 123 crystal. Further, bubbles, impurities, and so forth are often contained in the solder which has turned into a liquid phase in a half-molten state, and these too tend to remain in the form of a layer within the finally solidified portion after turned into voids, and the like.

This is attributable to a "pushing phenomenon" wherein epitaxial growth of the Yb 123 crystal makes progress from the surface of the base materials towards the central part of the solder, thicknesswise, in the course of gradual cooling after heating, so that the Yb 211 phase, BaO—CuO, impurity constituents, or the bubbles, and so forth, residing in an unsolidified portion of the solder, are shifted as if pushed towards the central part of the solder.

FIG. 3 is a schematic view illustrating the "pushing phenomenon".

When a solder of the Yb 123 superconductor constitution is sandwiched, for example, between base materials of the Y 123 superconducting bulk crystal, and heated, thereby rendering the solder into half-molten state, the solder in half-molten state is in a condition containing grains of the Yb 211 phase, bubbles, and so forth, in a BaO—CuO melt as shown in FIG. 3 (a). Then, as these are subjected to gradual cooling, superconducting Yb 123 crystals which are formed as a result of the grains of the Yb 211 phase, reacting with the BaO—CuO melt, undergo growth starting from the surface of respective Y 123 base materials towards the central part of the solder as shown in FIG. 3 (b). Hereupon, the grains of the Yb 211 phase, bubbles, and so forth, residing in an unsolidified portion of the melt, are pushed by the surface of the Yb 123 crystals which are growing, and come to cluster around the center of an unsolidified portion of the solder.

When the growth of the Yb 123 crystals makes further progress, reaching the final stage of solder solidification, segregation of the grains of the Yb 211 phase, not reacted as yet, bubbles, and the so forth, further increases in extent towards the central part of the solder as shown in FIG. 3 (c) with the result that the Y 123 base materials are joined together upon completion of solidification of the solder with the grains of the Yb 211 phase, bubbles, and the so forth, segregated in the shape of a layer traversing the entire cross section of the central part of the solder.

Since the Yb 211 phase, bubbles, and the so forth are non-superconducting, the finally solidified portion of the solder with those inclusions segregated in a layer-like shape in such a way as to block a current transmission path will constitute an obstacle to transmission of electric current as shown in FIG. 4. Accordingly, an oxide superconductor joined member produced by the means of joining together as described in the foregoing, interferes with transmission of superconducting current, and noticeably reduces current passing therethrough, so that a superconducting current lead wire and superconducting wire rod, produced by use of the oxide superconductor joined member, has been incapable of exhibiting fully satisfactory performance.

Under the circumstance, it is an object of the invention to provide means of achieving production of an oxide superconductor joined member, excellent in electric current transmission performance, without a need of going through particularly complex steps.

SUMMARY OF THE INVENTION

To this end, the inventors of the present invention have conducted intense studies and have reached at first the following conclusions:

a) a "process of joining together oxide superconductor base materials by use of a solder of an oxide superconductor material constitution, having a melting point (peritectic point) lower than that of the oxide superconductor base materials" is a simple and stable method as means of joining together oxide superconductors, however, with this process, epitaxial growth of superconducting crystals is caused to take place from the solder in a molten state, and consequently, it is extremely difficult to prevent non-superconducting particles, micropores, impurity constituents, and so forth from being segregated in the shape of a layer in a finally solidified portion of the solder.

(b) accordingly, in order to prevent a segregation layer formed in the finally solidified portion of the solder from interfering with transmission of electric current, it is required that the finally solidified portion of the solder is positioned in a region off a transmission path of electric current.

In view of the above, the inventors have continued further intense studies in an attempt to find out means for attaining such a condition as described above, and as a result, have succeeded in obtaining the following knowledge.

A) When joining oxide superconductor base materials with each other by use of a solder having a low melting point, if the base materials are joined together by disposing a superconducting solder on the surface of the base materials, other than the butting surface thereof, like bridge-building, so as to straddle both the base materials brought adjacently to each other, instead of sandwiching the solder between the base materials, this will bring a position of a finally solidified portion of the solder into a region on the outer surface side of the solder, opposite from the surface side of the respective base materials, so that the segregation layer comprising the non-superconducting particles, micropores, impurity constituents, and so forth will be positioned in a region, on the outer surface side of a superconducting binder (solidified and crystallized soldering material), where the transmission path of electric current will not be interfered with. Thus, a possibility of transmission of electric current through the oxide superconductor joined member being obstructed by non-superconducting inclusions is eliminated.

For example, FIG. 5 is a schematic view illustrating an example of an oxide superconductor joined member prepared by disposing a solder on the upper surface of base materials so as to straddle both the base materials brought adjacently to each other, like bridge-building, instead of sandwiching the solder between the base materials, and by joining together the base materials through gradual cooling of the solder after heating and melting the same.

In the case of the oxide superconductor joined member as described, solidification and crystallization of the solder proceed upward from the surface side of the oxide superconductor base materials, and final solidification is completed on the outer surface of the solder, so that non-superconducting particles, micropores, impurity constituents, and so forth which are present in the solder in a molten state are segregated on the outer surface side of the superconducting binder (solidified and crystallized soldering material). Accordingly, a transmission path of superconducting electric current, having no obstacle present therein, is secured, and as shown in FIG. 5, electric current can flow therethrough without interference by non-superconducting inclusions.

B) In this case, the configuration of the butting surface of the superconductor materials is rendered e.g. into a sloped open face, as shown in FIG. 7, parting from each other, other than the partial butting surface, thereby forming a sound junction face having an excellent configuration and workability.

C) Further, if the oxide superconductor joined member is made up so as to have a "constitution wherein the oxide superconductor base materials are joined with each other on at least a face thereof, other than the butting surface thereof, through the intermediary of a binder", it becomes possible to implement production of the oxide superconductor joined member wherein a transmission path of electric current will not be interfered with by the non-superconducting inclusions segregated as described in the foregoing even in the case of using an oxide superconductor, having a melting point superconductor, having a melting point lower than that of the base materials, as the binder. Moreover, it also becomes possible to join together the base materials, fully securing the transmission path of electric current, by use of a vapor deposited film formed by a vacuum deposition method, and the like, as the binder. In the case of using the vapor deposited film, and the like, as the binder, it is not necessarily required to use an oxide superconductor, having a low melting point, as the vapor deposited film, so that the same kind of superconductor as the base materials may be used.

The invention has been developed based on the above-described items. An object of the invention is to provide "a method of joining together oxide superconductors", and "an oxide superconductor joined member produced by the same" as follows.

A method of joining together oxide superconductors is disclosed whereby, when joining the oxide superconductors by use of a solder composed of an oxide superconducting material, a finally solidified portion of the solder is positioned in a region where a transmission path of electric current flowing between oxide superconductor base materials as joined together is not obstructed by adjusting a position of solder placement or a shape of a junction face of the respective oxide superconductor base materials.

A method of joining together oxide superconductors is disclosed, whereby the oxide superconductors are joined together by disposing the solder on a face of the oxide superconductor base materials, other than butting surfaces of the oxide superconductor base materials to be joined together so as to straddle both the oxide superconductor base materials like bridge-building.

A method of joining together oxide superconductors is disclosed, whereby the oxide superconductors are joined together by rendering at least portions of butting surfaces of the oxide superconductor base materials to be joined together into sloped open faces, parting from each other, and by disposing the solder over the sloped open faces.

A method of joining together oxide superconductors is disclosed, wherein the oxide superconductors to be joined together are RE 123-type superconducting bulk crystals (provided that RE refers to one kind of not less than two kinds of rare earth elements, selected from the group consisting of Y, La, Pr, Nd, Sm, Eu, Gd, Dy, Ho, Er, Tm, and Yb) prepared by a melt-solidifying process.

An oxide superconductor joined member is obtained by joining oxide superconductor base materials with each other through the intermediary of an oxide superconductor, serving as a binder, disposed on at least a face of the oxide superconductor base materials, other than butting surfaces thereof.

An oxide superconductor joined member is obtained by joining the oxide superconductor base materials with each other through the intermediary of an oxide superconductor, serving as a binder, interposed between angled and opposed faces of the oxide superconductor base materials.

An oxide superconductor joined member is disclosed, wherein the oxide superconductor base materials are RE 123-type superconducting bulk crystals (provided that RE refers to one kind or not less than two kinds of rare earth elements, selected from the group consisting of Y, La, Pr, Nd, Sm, Eu, Gd, Dy, Ho, Er, Tm, and Yb).

In this case, there is no particular limitation to the type of an oxide superconductor used for the base materials to be joined together, however, the RE 123-type superconducting bulk crystal (RE $Ba_2Cu_3O_y$ bulk crystal: RE refers to one kind or not less than two kinds of rare earth elements, selected from the group consisting of Y, La, Pr, Nd, Sm, Eu, Gd, Dy, Ho, Er, Tm, and Yb) which has been limited in application because of poor formability in spite of its high critical temperature and high critical current density is preferably used as the base materials. By so doing, the RE 123-type superconducting bulk crystal can have considerably expanded application.

Further, an oxide superconducting material having a melting point lower than that of the base materials, and having the same crystal structure as that of the base materials is preferably used as the solder used for joining together the oxide superconductor base materials. In the case of using such material as described above for the solder, the material is preferably rendered into powdered form in consideration of fusibility.

Table 1 shows a fusion (precursor) form and peritectic point (melting point) with reference to typical RE 123-type superconducting materials by way of example. In the case of joining together the base materials composed of the RE 123 superconducting bulk crystals, an RE 123 superconducting material having a peritectic point (melting point) lower than that of the base materials is selected as the solder.

TABLE 1

| RE 123-type superconductor material | fusion (precursor) form | peritectic point (K) | (° C.) |
|---|---|---|---|
| Yb 123 | Yb 211 + Ba$_3$Cu$_5$O$_y$ | (1248K) | (965° C.) |
| Y 123 | Y 211 + Ba$_3$Cu$_5$O$_y$ | (1278K) | (1005° C.) |
| Sm 123 | Sm 211 + Ba$_3$Cu$_5$O$_y$ | (1333K) | (1060° C.) |
| Nd 123 | Nd 211 + Ba$_3$Cu$_5$O$_y$ | (1363K) | (1090° C.) |

Operation

When joining together the oxide superconductor base materials by use of the solder in carrying out the invention, ingenuities are applied to a position of solder placement or to the shape of a junction face of the respective oxide superconductor base materials.

For example, one of the ingenuities is represented by a configuration of "disposing the solder on the upper surface of the base materials so as to straddle both the base materials brought adjacently to each other, like bridge-building, instead of holding the solder sandwiched between the base materials" as previously described with reference to FIG. 5.

If the position of solder placement is adjusted as above, solidification and crystallization of the solder will proceed upward from the surface side of the oxide superconductor base materials, and the finally solidified portion of the solder will be positioned in a region close to the outer surface thereof, away from the surface of the base materials, so that non-superconducting particles, micropores, impurity constituents, and so forth which have been present in the solder are shifted to the region close to the outer surface of the solder, and are segregated in the region. Accordingly, a transmission path of superconducting electric current, having no obstacle present therein, is secured through the junction.

FIG. 6 is a schematic view illustrating the behavior of the solder at the junction when joining together of the base materials is carried out by disposing the solder on the upper surface of the base materials so as to straddle both the base materials brought adjacently to each other, like bridge-building.

For example, if after a solder of Yb 123 superconductor constitution is placed on the upper surface of base materials of Y 123 superconducting bulk crystals so as to straddle both the base materials, like bridge-building, and the solder is rendered into a half-molten state by heating, the solder in a half-molten state is in a condition wherein grains of Yb 211 phase, pores, and so forth are contained in a BaO—CuO melt as shown in FIG. 6 (*a*). Thereafter, upon gradual cooling of these, superconducting Yb 123 crystals formed by reaction between the grains of the Yb 211 phase and the BaO—CuO melt undergo growth towards the upper portion of the solder, starting from the surface of the base materials of the Y 123 superconducting bulk crystals as shown in FIG. 6 (*b*). At this point in time, the grains of the Yb 211 phase, pores, and so forth which are present in an unsolidified portion of the melt are pushed by the uppermost surface of the Yb 123 crystals which are growing, and end up in clustering around the upper part of an unsolidified portion of the solder.

When the growth of the Yb 123 crystals makes further progress, reaching the final stage of solder solidification, the grains of the Yb 211 phase which have not undergone reaction as yet, pores, and so forth, pushed back by the uppermost surface of the growing Yb 123 crystals, will cluster in a region near the outermost surface of the solder, and will be segregated therein in the form of a layer, thereby completing solidification of the solder, and joining together the base materials of the Y 123 superconducting bulk crystals as shown in FIG. 6 (*c*).

Accordingly, as previously described with reference to FIG. 5, the segregation layer of non-superconducting inclusions is not formed on the base material side of the binder formed by crystallization and solidification of solder, so that a transmission path of superconducting electric current, having no obstacle present therein, is secured inside a joined member of Y 123 superconducting bulk crystals.

However, it is preferable that the configuration of the butting surface of the superconductor material is rendered e.g. into sloped open face, as shown in FIG. 7, parting from each other, other than the partial butting surface.

In this case, joining together of the base materials is implemented by overlaying the solder on the sloped open face of the respective base materials, and solidification of the soldering material starts from the sloped face of the respective base materials in the course of gradual cooling after heating. Meanwhile, as crystallization proceeds in the direction of the normal to the respective sloped face, the non-superconducting particles, micropores, impurity constituents, and so forth which are present in the soldering material are pushed in the direction of the normal to the respective sloped face, thereby being subjected to segregation on the outer surface of the solder. As a result, the segregation layer of the non-superconducting inclusions is not formed in this case either on the base material side of the binder formed by crystallization and solidification of solder, so that the transmission path of superconducting electric current, having no obstacle present therein, is secured inside the joined member of the superconducting bulk crystals.

Now, a single crystal (bulk crystal) of an oxide superconducting material has a crystal lattice arranged in a single direction, and consequently, has strong anisotropy, so that, if external force is applied thereto, the single crystal normally undergoes cleavage on a given crystal surface (in the case of RE 123-type oxide superconductor, the ab face thereof becomes a cleavage surface). Accordingly, crystal orientation is aligned across the entire cleavage surface thereof.

For this reason, in the case of joining together the oxide superconductor base materials with the butting surfaces thereof, rendered in the shape of the sloped open face, as shown in FIG. 7, crystals of the superconducting binder, formed from the solder in a molten state, undergo growth taking place gradually from the cleavage surface of the base materials, inevitably in the direction of the normal thereto in accordance with the orientation of the cleavage surface of the base materials, assuming that the sloped open face is the cleavage surface of the base materials. Accordingly, the orientation of the binder formed as a result of solidification of the solder can be aligned with that of the base materials without paying special attention to positioning of the binder as well as the base materials, so that a joined member having excellent superconductive properties can be obtained with ease.

As described hereinbefore, with the oxide superconductor joined member obtained by joining oxide superconductor base materials with each other through the intermediary of an oxide superconductor, serving as a binder, disposed on at least a face of the oxide superconductor base materials, other than the butting surfaces thereof, or the oxide superconductor joined member obtained by joining oxide superconductor base materials with each other through the intermediary of an oxide superconductor, serving as a binder, interposed between angled and opposed faces of the oxide superconductor base materials, prepared by applying ingenuities to the position of solder placement or to the shape of the junction face of the respective oxide superconductor base materials, there will be no presence of the segregation layer of the non-superconducting inclusions, and so forth in such a position as interferes with the transmission path of electric current through the junction, so that the oxide superconductor joined members as described can be applied to superconducting current lead wires and superconducting wire rods, excellent in electric current transmission performance.

Furthermore, with the joined oxide superconductor member obtained by joining oxide superconductor base materials with each other through the intermediary of an oxide superconductor, serving as a binder, disposed on at least a face of the oxide superconductor base materials, other than the butting surfaces thereof, or the joined oxide superconductor member obtained by joining oxide superconductor base materials with each other through the intermediary of an oxide superconductor, serving as a binder, interposed between angled and opposed faces of the oxide superconductor base materials, the binder (oxide superconducting material) making up the junction may be the vapor deposited film obtained by, for example, the vacuum deposition method.

More specifically, in this case, the makeup of the junction is not a butt-joined structure, and is inevitably at a disadvantage in terms of time required, however, it is possible to implement a junction whereby an excellent transmission path of superconducting electric current can be secured by depositing the vapor deposited films in layers, formed by use of the vacuum deposition method, and so forth, like bridge-building. In addition, in the case of using the vapor deposited film, and the like, as the binder, there is no need of using necessarily an oxide superconductor, having a melting point lower than that of the base materials, for the vapor deposited film, and accordingly, the same type of oxide superconductor as the base materials can be adopted therefor.

Further, the above-described means of joining together oxide superconductors, capable of obtaining excellent current transmission performance can be not only applicable to production of current lead wires made up of an oxide superconductor and superconducting wire rods, but also adopted as a method of joining together oxide superconductor thick filmed wire rods (LPE wire rods), and a method of repairing a coating of members coated with an oxide superconductor film.

BRIEF DESCRIPTION OF THE DRAWING

FIGS. 3(a)–3(c) are schematic views illustrating a pushing phenomenon as observed in carrying out the conventional method of joining together the Y 123 superconducting bulk crystals;

FIG. 4 is a schematic view illustrating an obstacle apt to occur to a joined member obtained by the conventional method of joining together the Y 123 superconducting bulk crystals;

FIG. 5 is a schematic view illustrating the condition of an oxide superconductor joined member according to a reference example;

FIGS. 6(a)–6(c) are schematic views illustrating the behavior of a solder at a junction in the process of joining together Y 123 superconducting bulk crystals according to a reference example;

DESCRIPTION OF THE PREFERRED EMBODIMENTS

The following examples representing preferred embodiments of the invention provide a more detailed description of the invention.

Reference Example 1

First, Y 123 superconducting bulk crystals ($Y_{1.8}Ba_{2.4}Cu_{3.4}O_y$) were prepared by a melt-solidifying process.

In the next step, a square member was cut from the Y 123 superconducting bulk crystals, respectively, by machining, and an attempt was made to join together two pieces of the square members as base materials to be joined together by use of a solder.

For the solder for use in a joining process, powders (powders of $Yb211+Ba_3Cu_5O_x$) of Yb 123 superconducting material ($Yb_{1.2}Ba_{2.1}Cu_{3.1}O_y$) constitution were used.

Figure 8:
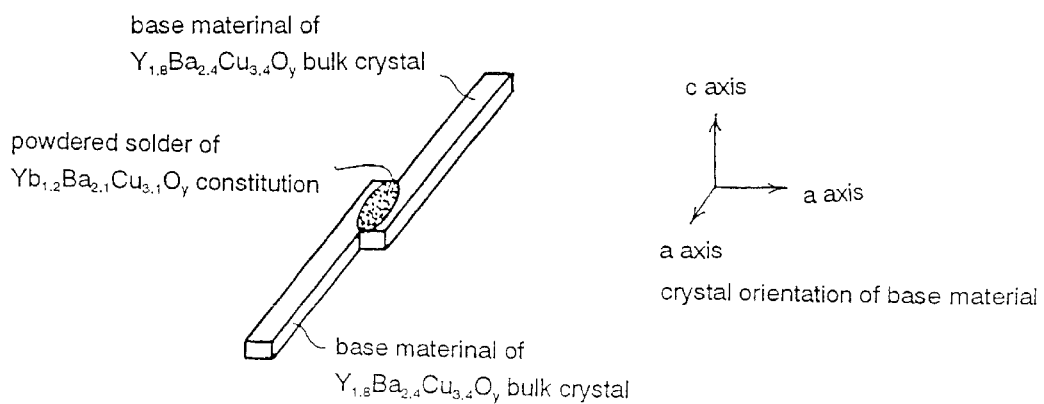
FIG. 8 is a schematic view illustrating a method of joining together Y 123 superconducting bulk crystals, as adopted in carrying out Example 1.

When joining together the base materials, the base materials were first laid such that a side face of one of the base materials, at one end thereof, was kept in intimate contact with a side face of another of the base materials, at one end thereof, so as to overlap each other as shown in FIG. 8, and the solder in powder form was overlaid on top of the overlapped part of the base materials so as to straddle both the base materials like bridge-building.

Subsequently, the base materials as overlapped were placed in a heating furnace, and subjected to heating and gradual cooling, thereby joining together the base materials by crystallizing the solder, and turning the same into a bridge-building-type Yb 123 superconducting binder.

Figure 9:
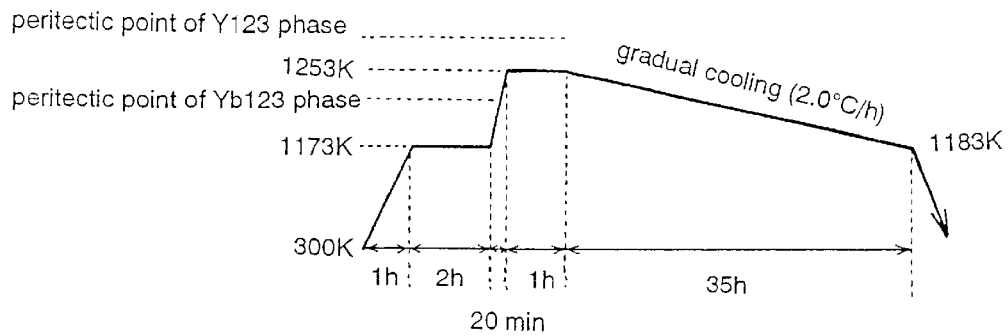
FIG. 9 is a diagram showing a heating and cooling curve of material adopted in carrying out Reference Example 1.

FIG. 9 shows a heating and cooling curve thereof at this point in time.

Studies conducted to find out the condition of a junction of a joined member thus obtained showed that a segregation layer containing grains of a Yb 211 phase, not reacted as yet, pores, impurity phases, and so forth was observed on the outer surface side of the binder, however, such a segregation layer as described was not present on a side of the binder, facing the base materials. Thus, it was confirmed that a transmission path of superconducting electric current, having no obstacle therein, was formed between the base materials.

Figure 1:
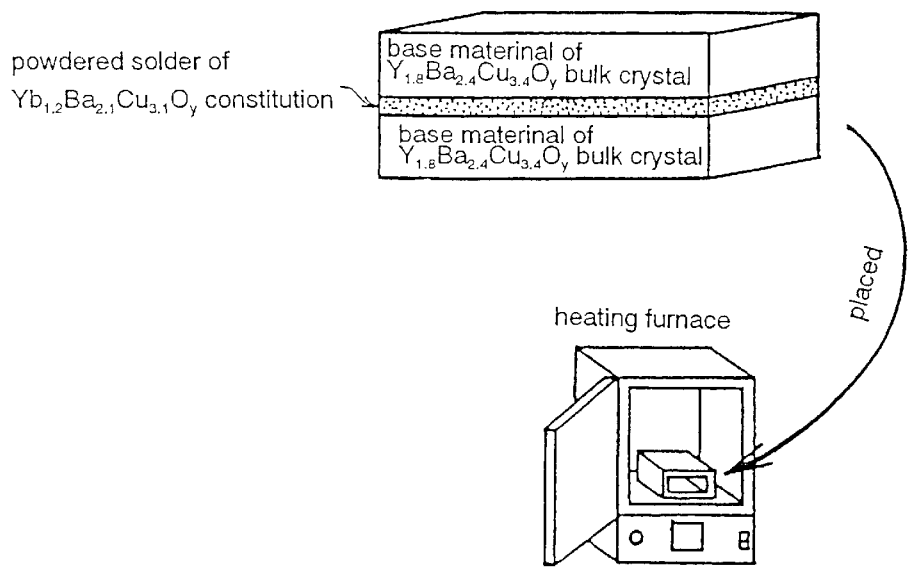
FIG. 1 is a schematic view illustrating a conventional method of joining together Y 123 superconducting bulk crystals.
Figure 2:
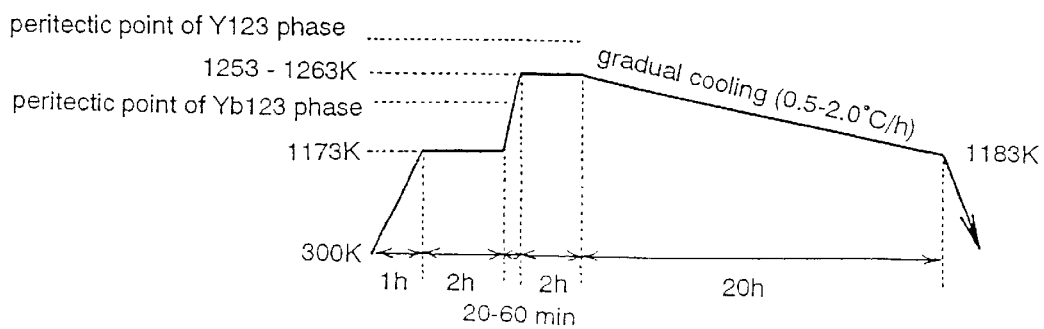
FIG. 2 is a diagram showing an example of a heating and cooling curve of material adopted for carrying out the conventional method of joining together the Y 123 superconducting bulk crystals.
Figure 7:
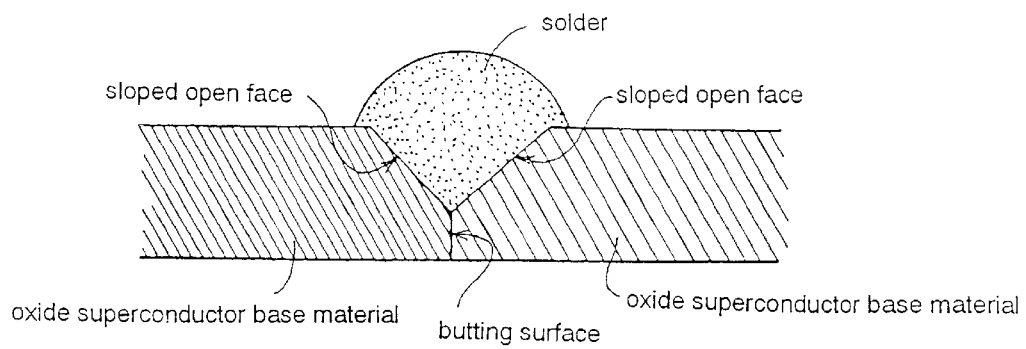
FIG. 7 is a schematic view illustrating an example of a method according to the invention.

Further, it has been found from results of comparison of transmission performance, made between a plurality of Y 123 joined members produced by joining together the base materials with the binder as shown in FIG. 1 sandwiched therebetween, and a plurality of Y 123 joined members obtained according to this example that the Y 123 joined members obtained according to this example has transmission performance which is enhanced by a factor of 2 to 10 over that of the former.

Reference Example 2

First, Nd 123 superconducting bulk crystals ($NdBa_2Cu_3O_y$) were prepared by a melt-solidifying process.

In the next step, a square member was cut from the Nd 123 superconducting bulk crystals, respectively, by machining, and an attempt was made to join together two pieces of the square members as base materials to be joined together by use of a solder.

For the solder for use in a joining process, powders (powders of Sm $211+Ba_3Cu_5O_x$) of Sm 123 superconducting material ($SmBa_2Cu_5O_y$) constitution were used.

Figure 10A:
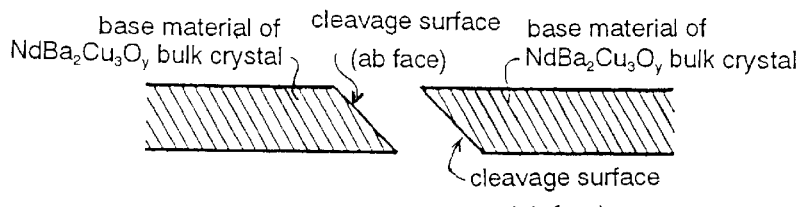
FIGS. 10(a)–10(c) are schematic views illustrating a method of joining together Nd 123 superconducting bulk crystals, as adopted in carrying out Example 1.
Figure 10B:
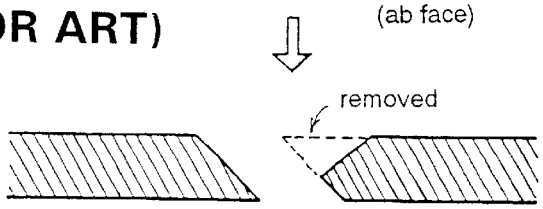
Figure 10C:
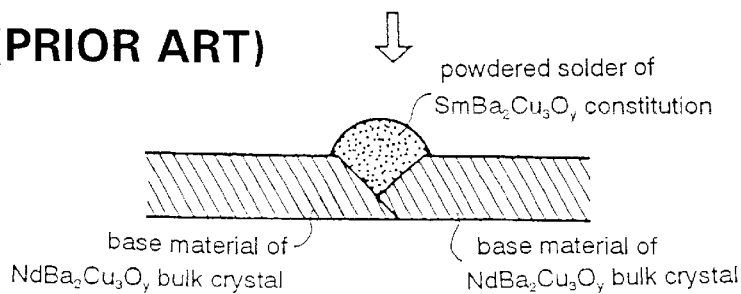

When joining together the base materials, the respective base materials were first cleaved at one end thereof as shown in FIG. 10 (a), exposing respective cleavage surfaces (ab faces), and thereafter, a portion of the end of one of the base materials was cut off as shown in FIG. 10 (b).

Then, the end of the one of the base materials, rendered in such a condition as above, was butted at the end of the other base material as shown in FIG. 10 (c), and the solder in powder form was overlaid on top of sloped surfaces at the end of both the base materials, butted at each other, in such a way as to straddle both the base materials like bridge-building.

Subsequently, the base materials as butt-joined were placed in a heating furnace, and subjected to heating and gradual cooling, thereby joining together the base materials by crystallizing the solder, and turning the same into a bridge-building-type Sm 123 superconductor binder.

Figure 11:
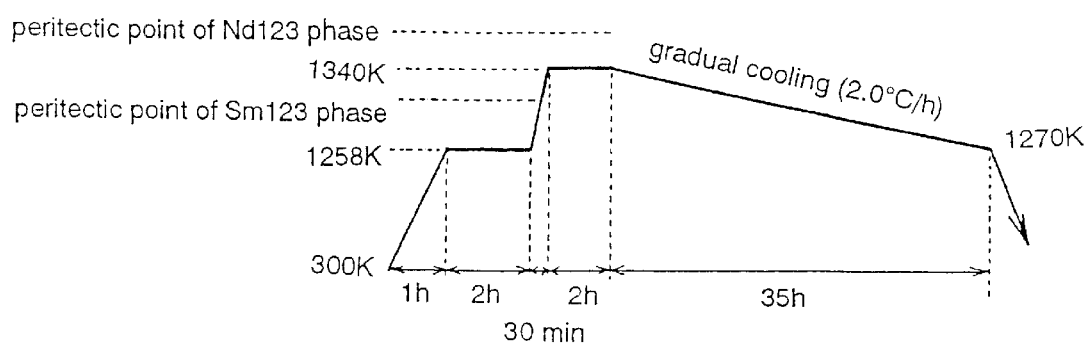
FIG. 11 is a diagram showing a heading and cooling curve of material adopted in carrying out Example 1.

FIG. 11 shows a heating and cooling curve thereof at this point in time.

Studies conducted to find out the condition of a junction of a joined member thus obtained showed that a segregation layer containing grains of a Sm 211 phase, not reacted as yet, pores, impurity phases, and so forth was observed on the outer surface side of the binder, however, such a segregation layer as described was not present at all in any other regions of the binder. Thus, it was confirmed that a transmission path of superconducting electric current, having no obstacle therein, was formed between the base materials.

Further, it has also turned out that since the base materials in this case are set at the time of the joining process such that the cleavage surfaces at the respective ends are butted at each other, the crystal orientations of both the base materials as they are aligned with each other, so that there hardly occurs any disarray to Sm 123 superconducting crystals (binder) which grow starting from the end surface of the respective base materials.

Further, it has been found from results of comparison of transmission performance, made between a plurality of Nd 123 joined members produced by joining together the base materials with the binder as shown in FIG. 1 sandwiched therebetween, and a plurality of Nd 123 joined members obtained according to this example that the Nd 123 joined members obtained according to this example has transmission performance which is enhanced by a factor of 5 to 10 over that of the former.

As described hereinbefore, according to the invention, it is possible to provide an oxide superconductor joined member, excellent in electric current transmission performance, without a need of going through particularly complex steps, so that the invention can bring about very useful effects from an industrial point of view such as making significant contributions to enhancement in performance of superconducting current lead materials, superconducting wire rods, and so forth.

What is claimed is:

1. A method of joining together oxide superconductors whereby, when joining the oxide superconductors by use of a solder composed of an oxide superconducting material, a finally solidified portion of the solder is positioned in a region where a transmission path of electric current flowing between oxide superconductor base materials as joined together is not obstructed by rendering at least portions of butting surfaces of the oxide superconductor base materials to be joined together into sloped open faces, parting from each other, and by disposing the solder over the sloped open faces after the butting surfaces other than those of the sloped open faces are butted against each other, thereby shifting non-superconducting particles, micropores and impurity constituents to an outer surface of the joined superconductors.

2. The method of joining together oxide superconductors according to claim 1, wherein the oxide superconductors to be joined together are RE 123-type superconducting bulk crystals provided that RE refers to one kind or not less than two kinds of rare earth elements, selected from the group consisting of Y, La, Pr, Nd, Sm, Eu, Gd, Dy, Ho, Er, Tm, and Yb prepared by a melt-solidifying process.

3. An oxide superconductor joined member obtained by joining oxide superconductor base materials with each other through the intermediary of an oxide superconductor, serving as a binder, interposed between angled and opposed sloped faces other than butting surfaces of the oxide superconductor base materials so that non-superconducting particles, micropores and impurity constituents are shifted to an outer surface of the superconductor joined member.

4. The oxide superconductor joined member according to claim 3, wherein the oxide superconductor base materials are RE 123-type superconducting bulk crystals provided that RE refers to one kind or not less than two kinds of rare earth elements, selected from the group consisting of Y, La, Pr, Nd, Sm, Eu, Gd, Dy, Ho, Er, Tm, and Yb.

5. A method of joining at least first and second oxide superconductors comprising the steps of:

preparing at least first and second oxide superconductors comprising superconducting bulk crystals using a melt-solidifying process, each of said superconductors having at least one face defined by a flat outer surface;

cutting a member from each of the first and second oxide superconductors to form respective faces defined by first and second sloped surfaces;

positioning the faces defined by flat outer surfaces of the first and second oxide superconductors in intimate surface-to-surface contact with each other and free from any elements therebetween, while positioning the faces defined by the first and second sloped surfaces to oppose each other in an open facing relationship;

providing solder on the faces defined by the sloped surfaces of the respective first and second superconductors;

heating the solder on the sloped open faces to a half molten state; and gradually cooling the solder such that non-superconducting particles, micropores, and impurity constituents present in the solder move in a direction normal to the respective sloped faces to form a segregation layer of non-superconducting inclusions disposed outwardly from an electrical transmission path formed in the solder and from the first and second oxide superconductors.

6. The method of to joining the first and second oxide superconductors of claim 5, wherein the solder comprises an oxide superconductor powder.

7. The method of joining the first and second oxide superconductors of claim 5, wherein the first and second oxide superconductors comprise current lead wires or rods.

8. The method of joining the first and second oxide superconductors of claim 5, wherein the solder has a peritectic point lower than the peritectic point of the first and second oxide superconductors.

9. The method of joining the first and second oxide superconductors of claim 5, wherein the open faces of the respective first and second superconductors are arranged opening in an upward direction so that the solder is applied to respective upper surfaces of the respective first and second superconductors.

10. A method of joining at least first and second oxide superconductors comprising the steps of:

preparing at least first and second oxide superconductors comprising superconducting bulk crystals using a melt-solidifying process, each of said superconductors having at least one flat outer surface;

cutting at least one member from each of the first and second oxide superconductors to form respective first and second faces defined by flat differently sloped surfaces joining each other at one end of the first oxide superconductor and a third face defined by a flat sloped surface at one end of the second oxide superconductor;

positioning the first and second oxide superconductors so that the first face defined by a flat sloped surface is in intimate surface-to-surface contact with the third face defined by a flat sloped surface and free from any elements therebetween, and the second face defined by a flat sloped surface and a remaining portion of the third face defined by a flat sloped surface oppose each other in facing relationship;

providing solder on the sloped open faces of the respective first and second superconductors;

heating the solder on the sloped open faces to a half molten state; and gradually cooling the solder such that non-superconducting particles, micropores, and impurity constituents present in the solder move in a direction normal to the respective sloped face to form a segregation layer of non-superconducting inclusions disposed outwardly from an electrical transmission path formed in the solder and disposed outwardly from the first and second oxide superconductors.

11. The method of joining the first and second oxide superconductors of claim 10, wherein the solder comprises an oxide superconductor powder.

12. The method of joining the first and second oxide superconductors of claim 10, wherein the first and second oxide superconductors comprise current lead wires or rods.

13. The method of joining the at least first and second oxide superconductors of claim 10, wherein the solder has a peritectic point lower than the peritectic point of the first and second oxide superconductors.

14. The method of joining the at least first and second oxide superconductors of claim 10, wherein the open faces of the respective first and second superconductors are arranged opening in an upward direction so that the solder is applied to respective upper surfaces of the respective first and second superconductors.

* * * * *